(12) United States Patent
Ueda et al.

(10) Patent No.: US 6,369,412 B1
(45) Date of Patent: Apr. 9, 2002

(54) SEMICONDUCTOR INTEGRATED DEVICE COMPRISING A PLURALITY OF BASIC CELLS

(75) Inventors: Yoshitaka Ueda; Isao Ogura, both of Ohgaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/238,733

(22) Filed: Jan. 28, 1999

(30) Foreign Application Priority Data

Jan. 29, 1998 (JP) .......................................... 10-017394

(51) Int. Cl.⁷ .............................................. H01L 27/10
(52) U.S. Cl. ...................... 257/206; 257/208; 257/241; 257/249; 257/331; 257/365; 257/392
(58) Field of Search ................................. 257/206, 208, 257/241, 249, 365, 392, 331, 207

(56) References Cited

U.S. PATENT DOCUMENTS

| | | | | |
|---|---|---|---|---|
| 4,745,084 A | * | 5/1988 | Rowson et al. ................ | 437/51 |
| 5,164,811 A | * | 11/1992 | Tamura ....................... | 257/206 |
| 5,250,823 A | * | 10/1993 | Veendrick et al. .......... | 257/206 |
| 5,420,447 A | * | 5/1995 | Waggoner ................... | 257/206 |
| 5,751,033 A | * | 5/1998 | Miya ........................... | 257/270 |
| 5,920,089 A | * | 7/1999 | Kanazawa et al. .......... | 257/202 |
| 6,144,079 A | * | 11/2000 | Shirahata et al. ............ | 257/392 |
| 6,157,056 A | * | 12/2000 | Takeuchi et al. ............. | 257/315 |

FOREIGN PATENT DOCUMENTS

| | | | | |
|---|---|---|---|---|
| EP | 0 782 188 | 7/1997 | | |
| JP | 60-065546 | 4/1985 | | |
| JP | 63314847 A | * 12/1988 | ........... | H01L/21/82 |
| JP | 63314847 A | * 12/1988 | ........... | H01L/21/82 |
| JP | 2-181949 | 7/1990 | | |
| JP | 02-284468 | 11/1990 | | |
| JP | 3-8357 | 1/1991 | | |
| JP | 4-10468 | 1/1992 | | |
| JP | 04010468 A | * 1/1992 | ......... | H01L/27/118 |
| JP | 05-048050 | 2/1993 | | |
| JP | 5-063046 | 3/1993 | | |
| JP | 05-206415 | 8/1993 | | |
| JP | 5-299508 | 11/1993 | | |
| JP | 06-045565 | 2/1994 | | |
| JP | 6-501813 | 2/1994 | | |

\* cited by examiner

*Primary Examiner*—Eddie Lee
*Assistant Examiner*—Matthew E. Warren
(74) *Attorney, Agent, or Firm*—Armstrong, Westerman & Hattori, LLP

(57) ABSTRACT

A plurality of first basic cells and a plurality of second basic cells are formed on a semiconductor substrate. A gate electrode of each of transistors in the first basic cell has a gate length of the minimum size. A gate electrode of each of transistors in the second basic cell has a second gate length larger than the first gate length. The transistors in the first basic cell are connected to each other, to construct a circuit which is operable at high speed and can be increased in integration density. The transistors in the second basic cell are connected to each other, to construct a circuit which can be reduced in power consumption and is hardly affected by process variations.

16 Claims, 10 Drawing Sheets

US 6,369,412 B1

SEMICONDUCTOR INTEGRATED DEVICE COMPRISING A PLURALITY OF BASIC CELLS

BACKGROUND OF THE INVENTION

The present invention relates generally to a semiconductor device and a semiconductor integrated circuit device comprising the same, and more particularly, to a semiconductor integrated circuit device having transistors which are arbitrarily connected to each other and the structure of a basic cell constituting the same.

BACKGROUND OF THE INVENTION

Conventionally, in order to rapidly cope with a request from a customer, a master slice system for uniformly performing design of an LSI (Large Scale Integrated Circuit) to diffusion processing in advance, and performing only later circuit wiring for each type has been well known. The master slice system has advantages suitable for the production of few-of-a-kind LSIs, for example, shortening of a period of development and reduction of costs of development.

The semiconductor integrated circuit device of a master slice system is realized by connecting a plurality of basic cells arranged in a matrix shape or in one direction in conformity to specifications of its finished product.

For example, the structure of a general basic cell carried on a semiconductor integrated circuit device of a master slice system as described in JP-A-5-630465 is illustrated in FIG. 11.

As shown in FIG. 11, a basic cell 100 is constituted by gate electrodes 101 and 102 of a P-type MOS (Metal Oxide Semiconductor) transistor, a P-type impurity diffusion region 103 to be a drain terminal or a source terminal of the P-type MOS transistor, gate electrodes 104 and 105 of an N-type MOS transistor, an N-type impurity diffusion region 106 to be a drain terminal or a source terminal of the N-type MOS transistor, and two power supply interconnections 107 and 108.

In the semiconductor integrated circuit device of the master slice type, the plurality of basic cells 100 each having such a structure are arranged on a semiconductor substrate. The gate length L of each of the transistors in each of the basic cells 100 greatly affects the performance and the cost of the semiconductor integrated circuit device. That is, the shorter the gate length L of each of the transistors is, the higher the speed of the transistor can be made. Further, it is possible to realize a circuit on the same scale by an LSI having a small area by improving its device density.

By reducing the gate length L of each of the transistors, therefore, the semiconductor integrated circuit device is increased in scale, increased in integration density, and increased in speed. In recent years, the reduction in the gate length L of each of the transistors has progressed, for example, 0.5 $\mu$M, 0.35 $\mu$m, and 0.25 $\mu$m. Even in the semiconductor integrated circuit device of the master slice type, the gate length L of the P-type MOS transistor and the N-type MOS transistor which are formed in each of the basic cells 100 is set to the minimum size.

As described in the foregoing, if in the semiconductor integrated circuit device of the master slice type, the basic cell having the gate length L of the minimum size is used, the semiconductor integrated circuit device can be increased in speed and increased in integration density.

If the gate length of the transistor is reduced, however, power consumption is increased by the increase in a leak current, and the effect of variations in a finning process is increased. For example, when the variations in the gate length are the same, the smaller the gate length is, the larger the ratio of the variations in the gate length to the normal gate length is, so that the larger the effect of the process variations on device characteristics is. As a result, the yield of the semiconductor integrated circuit device is reduced. There also occurs a case where margin must be provided to actual device operations in consideration of the process variations. As a result, the performance of the semiconductor integrated circuit device is reduced.

SUMMARY OF THE INVENTION

An object of the present invention is to provide a semiconductor device and a semiconductor integrated circuit device which can achieve low power consumption while achieving high speed and high integration density, and the yield and the performance of which can be prevented from being reduced by process variations.

A semiconductor integrated circuit device according to the present invention comprises a substrate, and a plurality of basic cells formed on the substrate, each of the plurality of basic cells comprising one or more transistors, the one or more transistors in at least one of the plurality of basic cells having a gate length different from that of the one or more transistors in the other basic cell.

In the semiconductor integrated circuit device, the one or more transistors in at least one of the basic cells has a gate length different from that of the one or more transistors in the other basic cell, thereby making it possible to select the basic cells depending on the necessity of operating at high speed, the necessity of reducing power consumption, and the necessity of design precision. Consequently, it is possible to construct a circuit which is operable at high speed and can be increased in integration density using the basic cell having a small gate length, and construct a circuit which can be reduced in power consumption and is hardly affected by process variations using the basic cell having a large gate length.

As a result, it is possible to achieve low power consumption while achieving high speed and high integration density as a whole, and prevent the yield and the performance from being reduced by process variations.

Each of the plurality of basic cells may include a plurality of the transistors arranged such that they can be selectively combined with each other, and the plurality of transistors in at least one of the plurality of basic cells may have a gate length different from that of the plurality of transistors in the other basic cell.

In this case, the plurality of transistors in at least one of the basic cells has a gate length different from that of the plurality of transistors in the other basic cell, thereby making it possible to select the basic cells depending on the necessity of operating at high speed, the necessity of reducing power consumption, and the necessity of design precision. Consequently, it is possible to construct a circuit which is operable at high speed and can be increased in integration density using the basic cell having a small gate length, and construct a circuit which can be reduced in power consumption and is hardly affected by process variations using the basic cell having a large gate length.

As a result, it is possible to achieve low power consumption while achieving high speed and high integration density, and prevent the yield and the performance from being reduced by process variations.

At least one of the plurality of transistors may have a gate length different from that of the other transistors in each of the basic cells.

In this case, the transistors can be selected depending on the necessity of operating at high speed, the necessity of reducing power consumption, and the necessity of design precision in each of the basic cells. Consequently, it is possible to construct a circuit which is operable at high speed and can be increased in integration density by connecting the transistors having a small gate length in each of the basic cells, and construct a circuit which can be reduced in power consumption and is hardly affected by process variations by connecting the transistors having a large gate length.

As a result, it is possible to achieve low power consumption while achieving high speed and high integration density for each of the basic cells as a whole, and prevent the yield and the performance from being reduced by process variations.

At least one of the plurality of transistors may be arranged in a direction different from the direction in which the other transistors are arranged in each of the basic cells.

In this case, at least one of the transistors is arranged in the direction different from the direction in which the other transistors are arranged, so that the degree of freedom in the direction of line connection is increased.

The one or more transistors in each of the basic cells may include one or a plurality of transistors of a first conductivity type and one or a plurality of transistors of a second conductivity type, the one or a plurality of transistors of the first conductivity type and the one or a plurality of transistors of the second conductivity type being arranged such that they can be selectively combined with each other, and the one or a plurality of transistors of the first conductivity type and the one or a plurality of transistors of the second conductivity type in at least one of the plurality of basic cells may have a gate length different from that of the one or a plurality of transistors of the first conductivity type and the one or a plurality of transistors of the second conductivity type in the other basic cell.

In this case, the one or more transistors of the first conductivity type and the one or more transistors of the second conductivity type in at least one of the basic cells have a gate length different from that of the one or more transistors of the first conductivity type and the one or more transistors of the second conductivity type in the other basic cell, thereby making it possible to select the basic cells depending on the necessity of operating at high speed, the necessity of reducing power consumption, and the necessity of design precision. Consequently, it is possible to construct a circuit which is operable at high speed and can be increased in integration density using the basic cell having a small gate length, and construct a circuit which can be reduced in power consumption and is hardly affected by process variations using the basic cell having a large gate length.

As a result, it is possible to achieve low power consumption while achieving high speed and high integration density as a whole, and prevent the yield and the performance from being reduced by process variations.

The one or more transistors in each of the basic cells may include one or a plurality of transistor pairs each comprising a transistor of a first conductivity type and a transistor of a second conductivity type, the one or a plurality of transistor pairs being arranged such that they can be selectively combined with each other, the transistor of the first conductivity type and the transistor of the second conductivity type in each of the transistor pairs may share a gate electrode, and the gate electrode of each of the one or a plurality of transistor pairs in at least one of the plurality of basic cells may have a gate length different from that of the gate electrode of each of the one or a plurality of transistor pairs in the other basic cell.

In this case, a gate electrode of each of the one or more transistor pairs in at least one of the basic cells has a gate length different from that of a gate electrode of each of the one or more transistors in the other basic cell, thereby making it possible to select the basic cell depending on the necessity of operating at high speed, the necessity of reducing power consumption, and the necessity of design precision. Consequently, it is possible to construct a circuit which is operable at high speed and can be increased in integration density using the basic cell having a small gate length, and construct a circuit which can be reduced in power consumption and is hardly affected by process variations using the basic cell having a large gate length.

As a result, it is possible to achieve lower power consumption while achieving high speed and high integration density, and prevent the yield and the performance from being reduced by process variations.

The one or more transistors in each of the basic cells may comprise a gate electrode having a wide portion at its center or end.

In this case, it is possible to increase the degree of freedom in line connection and shorten interconnections utilizing the wide portion provided at the center or the end of the gate electrode of the one or more transistors.

Each of the basic cells may further comprise an interconnection line provided in a space among the one or more transistors.

In this case, it is possible to increase the degree of freedom of line connection and shorten the interconnections by utilizing the interconnection line provided in the space.

Each of the basic cells may be formed in a cell region in a square shape, and further comprise a power supply line provided along at least one side of the cell region.

In this case, it is possible to connect the transistors to the power supply line while minimizing the intersection of the interconnections.

The plurality of transistors or the plurality of transistor pairs may be arranged such that they can be selectively combined with each other in each of the basic cells.

In this case, the basic cells are selected depending on the necessity of operating at high speed, the necessity of reducing power consumption and the necessity of design precision, thereby making it possible to construct a circuit which is operable at high speed and can be increased in integration density using the plurality of transistors or the plurality of transistor pairs in the basic cell having a small gate length, and construct a circuit which can be reduced in power consumption and is hardly affected by process variations using the plurality of transistors or the plurality of transistor pairs in the basic cell having a large gate length.

As a result, it is possible to achieve lower power consumption while achieving high speed and high integration density as a whole, and prevent the yield and the performance from being reduced by process variations.

A semiconductor integrated circuit device according to another aspect of the present invention comprises a substrate, one or a plurality of first basic cells formed on the substrate, and one or a plurality of second basic cells formed on the substrate, the first basic cell comprising one or more transistors arranged such that they can be selectively combined with each other and having a first gate length, the second basic cell comprising one or more transistors arranged such that they can be selectively combined with each other and having a second gate length larger than the first gate length, the one or more transistors in at least one of the one or a plurality of first basic cells being connected to each other, to construct a first circuit which is operable at high speed, the one or more transistors in at least one of the one or a plurality of second basic cells being connected to each other, to construct a second circuit which is operable with low power consumption and operable with high precision.

In the semiconductor integrated circuit device, it is possible to construct the first circuit which is operable at high speed by connecting the one or more transistors having the first gate length in at least one of the first basic cells, and construct the second circuit which can be reduced in power consumption and operable with high precision by connecting the one or more transistors having the second gate length in at least one of the second basic cells.

In this case, the first circuit is constituted by the one or more transistors having a small gate length, so that the occupied area is reduced. The second circuit is constituted by the one or more transistors having a large gate length, so that it is hardly affected by process variations.

Consequently, it is possible to achieve low power consumption while achieving high speed and high integration density as a whole and prevent the yield and the performance from being reduced by process variations.

A semiconductor integrated circuit device according to still another aspect of the present invention comprises a substrate, and a plurality of basic cells formed on the substrate, each of the basic cells comprising a plurality of transistors arranged such that they can be selectively combined with each other, and at least one of the plurality of transistors having a gate length different from that of the other transistors in at least one of the basic cells.

In the semiconductor integrated circuit device, at least one of the transistors in at least one of the basic cells has a gate length different from that of the other transistors, thereby making it possible to select the transistors depending on the necessity of operating at high speed, the necessity of reducing power consumption, and the necessity of design precision. Consequently, it is possible to construct a circuit which is operable at high speed and can be increased in integration density by connecting the transistors having a small gate length, and construct a circuit which can be reduced in power consumption and is hardly affected by process variations by connecting the transistors having a large gate length.

As a result, it is possible to achieve lower power consumption while achieving high speed and high integration density, and prevent the yield and the performance from being reduced by process variations.

At least one of the plurality of transistors may be arranged in a direction different from the direction in which the other transistors are arranged in each of the basic cells.

In this case, at least one of the transistors is arranged in the direction different from the direction in which the other transistors are arranged, so that the degree of freedom in the direction of line connection is increased.

A semiconductor device according to a further aspect of the present invention comprises a substrate, and a plurality of transistors arranged such that they can be selectively combined with each other on the substrate, at least one of the plurality of transistors having a gate length different from that of the other transistors.

In the semiconductor device, at least one of the transistors has a gate length different from that of the other transistors, thereby making it possible to select the transistors depending on the necessity of operating at high speed, the necessity of reducing power consumption, and the necessity of design precision. Consequently, it is possible to construct a circuit which is operable at high speed and can be increased in integration density by connecting the transistors having a small gate length, and construct a circuit which can be reduced in power consumption and is hardly affected by process variations by connecting the transistors having a large gate length.

Consequently, the semiconductor device according to the present invention is used as a basic cell, thereby making it possible to realize a semiconductor integrated circuit device which can achieve lower power consumption while achieving high speed and high integration density as a whole, and the yield and the performance of which can be prevented from being reduced by process variations.

The plurality of transistors may include one or a plurality of transistors of a first conductivity type and one or a plurality of transistors of a second conductivity type, the one or a plurality of transistors of the first conductivity type and the one or a plurality of transistors of the second conductivity type may be arranged such that they can be selectively combined with each other.

In this case, at least one of the transistors has a gate length different from that of the other transistors, thereby making it possible to select the transistors of the first conductivity type and the transistors of the second conductivity type depending on the necessity of operating at high speed, the necessity of reducing power consumption, and the necessity of design precision. Consequently, it is possible to construct a circuit which is operable at high speed and can be increased in integration density by connecting the transistors having a small gate length, and construct a circuit which can be reduced in power consumption and is hardly affected by process variations by connecting the transistors having a large gate length.

Consequently, the semiconductor device according to the present invention is used as a basic cell, thereby making it possible to realize a semiconductor integrated circuit device which can achieve low power consumption while achieving high speed and high integration density as a whole, and the yield and the performance of which can be prevented from being reduced by process variations.

The plurality of transistors may include a plurality of transistor pairs each comprising a transistor of a first conductivity type and a transistor of a second conductivity type, the plurality of transistor pairs being arranged such that they can be selectively combined with each other, the transistor of the first conductivity type and the transistor of the second conductivity type in each of the transistor pairs may share a gate electrode, and the gate electrode of at least one of the plurality of transistor pairs may have a gate length different from the gate electrode of the other transistor pair.

In this case, the gate electrode of at least one of the transistor pairs has a gate length different from the gate electrode of the other transistor pair, thereby making it possible to select the transistor pairs depending on the necessity of operating at high speed, the necessity of reducing power consumption, and the necessity of design precision. Accordingly, it is possible to construct a circuit which is operable at high speed and can be increased in integration density by connecting the transistor pairs having a small gate length, and construct a circuit which can be reduced in power consumption and is hardly affected by process variations by connecting the transistor pairs having a large gate length.

Consequently, the semiconductor device according to the present invention is used as a basic cell, thereby making it possible to realize a semiconductor integrated circuit device which can achieve low power consumption while achieving high speed and high integration density as a whole, and the yield and the performance of which can be prevented from being reduced by process variations.

The plurality of transistors may include a plurality of transistors having a first gate length and a plurality of transistors having a second gate length larger than the first gate length, the plurality of transistors having the first gate length may be connected to each other, to construct a first circuit which is operable at high speed, and the plurality of transistors having the second gate length may be connected to each other, to construct a second circuit which is operable with low power consumption and operable with high precision.

In this case, the first circuit which is operable at high speed is constructed by connecting the plurality of transistors having the first gate length, and the second circuit which is operable with low power consumption and operable with high precision by connecting the plurality of transistors having the second gate length. In this case, the first circuit is constituted by the plurality of transistors having a small gate length, so that the occupied area is reduced. Further, the second circuit is constituted by the plurality of transistors having a large gate length, so that it is hardly affected by process variations.

Consequently, the semiconductor device according to the present invention is used as a basic cell, thereby making it possible to realize a semiconductor integrated circuit device which can achieve low power consumption while achieving high speed and high integration density as a whole, and the yield and the performance of which can be prevented from being reduced by process variations.

At least one of the plurality of transistors may be arranged in a direction different from the direction in which the other transistors are arranged.

In this case, at least one of the transistors is arranged in the direction different from the direction in which the other transistors are arranged, so that the degree of freedom in the direction of line connection is increased.

The semiconductor device may further comprise an interconnection line provided in a space among the plurality of transistors on the substrate.

In this case, the interconnection line provided in the space among the plurality of transistors is utilized, thereby making it possible to increase the degree of freedom in line connection and shorten the interconnections.

The plurality of transistors may be arranged in a cell region in a square shape, and the semiconductor device may further comprise a power supply line provided along at least one side of the cell region.

In this case, it is possible to connect the transistors to the power supply line while minimizing the intersection of the interconnections.

Each of the plurality of transistors may comprise a gate electrode having a wide portion at its center or end.

In this case, the wide portion provided at the center or the end of the gate electrode of the plurality of transistors is utilized, thereby making it possible to increase the degree of freedom in line connection and shorten the interconnections.

The foregoing and other objects, features, aspects and advantages of the present invention will become more apparent from the following detailed description of the present invention when taken in conjunction with the accompanying drawings.

PREFERRED EMBODIMENTS OF THE PRESENT INVENTION (1) First Embodiment

Figure 1:
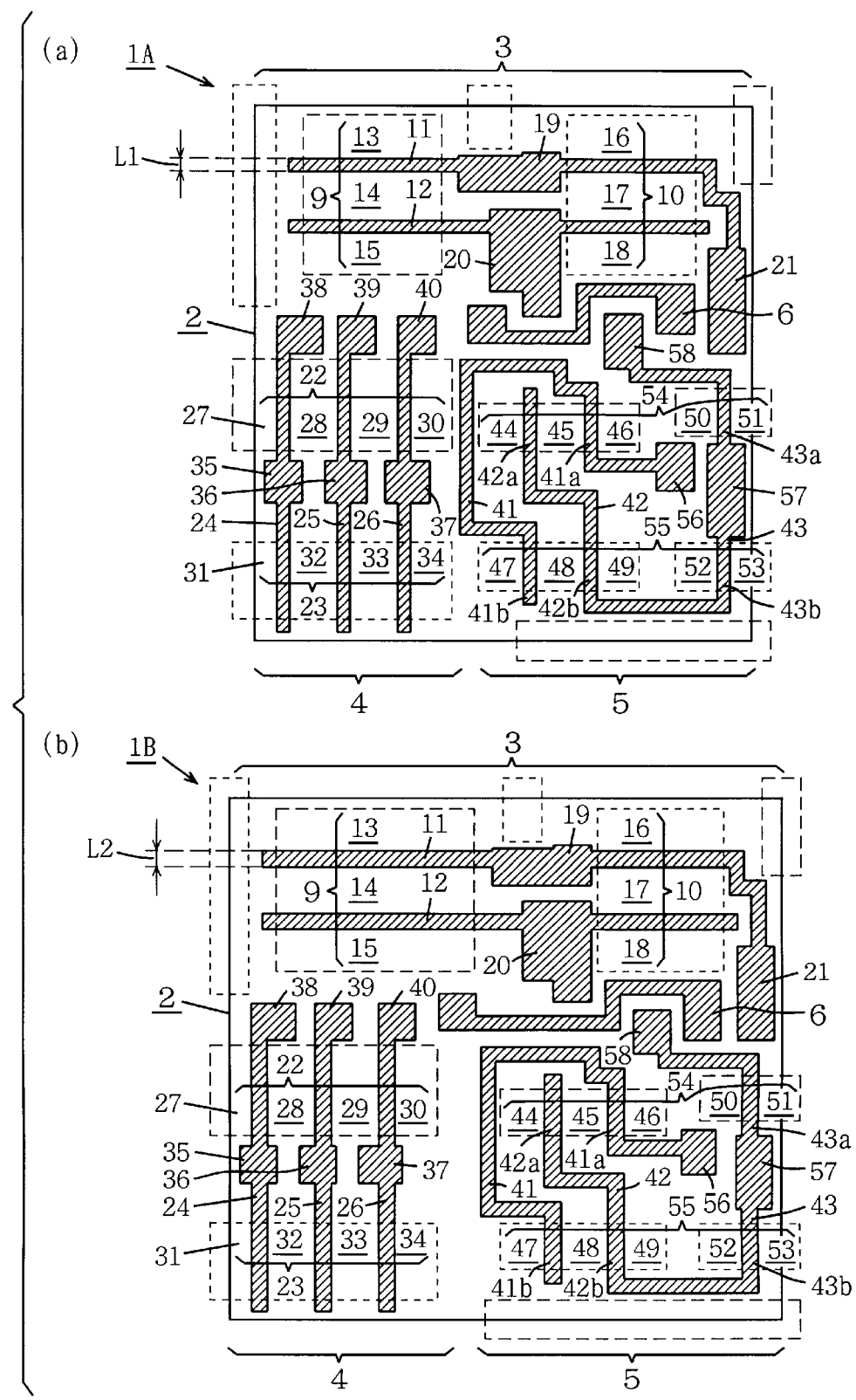
FIG. 1 is a plan view showing the structures of first and second basic cells constituting a gate array semiconductor integrated circuit device of a master slice system in a first embodiment of the present invention.

FIG. 1 is a plan view showing the structure of basic cells constituting a gate array semiconductor integrated circuit device of a master slice system in a first embodiment of the present invention, where (a) illustrates a first basic cell, and (b) illustrates a second basic cell.

As shown in FIG. 1(a), a first basic cell 1A is formed in a cell region 2 in a square shape on a semiconductor substrate composed of silicon. The cell region 2 is constituted by a first device region 3, in an upper part of FIG. 1(a), occupying an area which is approximately one-third that of the cell region 2, a second device region 4, in a lower left part of FIG. 1(a), occupying an area which is approximately one-fourth that of the cell region 2, a third device region 5, in the lower right, occupying an area which is approximately one-third that of the cell region 2, and an interconnection pattern 6 provided in a space between the first device region 3 and the third device region 5. The interconnection pattern 6 is composed of tungsten polyside, for example.

The first device region 3 is provided with a first P-type transistor group 9 and a first N-type transistor group 10.

The first P-type transistor group 9 comprises first and second gate electrodes 11 and 12 composed of polysilicon, extending in the horizontal direction in FIG. 1(a), parallel to each other, and first, second and third P-type source-drain regions 13, 14 and 15 spaced apart from each other in the vertical direction by left parts of the first and second gate electrodes 11 and 12.

The first N-type transistor group 10 comprises first and second gate electrodes 11 and 12, and first, second and third N-type source-drain regions 16, 17 and 18 spaced apart from each other in the vertical direction by right parts of the first and second gate electrodes 11 and 12.

Specifically, the two P-type transistors in the first P-type transistor group 9 and the two N-type transistors in the first N-type transistor group 10 respectively share the first gate electrode 11 or the second gate electrode 12 in a one-to-one correspondence.

Furthermore, in order to effectively utilize a space in the first device region 3, wide portions 19, 20 and 21 which can form contacts are formed by enlarging suitable portions such as centers and ends of the first and second gate electrodes 11 and 12.

The second device region 4 is provided with a second P-type transistor group 22 and a second N-type transistor group 23.

The second P-type transistor group 22 comprises third, fourth and fifth gate electrodes 24, 25 and 26 composed of polysilicon, extending in the vertical direction in FIG. 1(a), parallel to each other, and fourth, fifth, sixth and seventh P-type source-drain regions 27, 28, 29 and 30 spaced apart from each other in the horizontal direction by upper parts of the third to fifth gate electrodes 24 to 26.

The second N-type transistor group 23 comprises the third to fifth gate electrodes 24 to 26, and fourth, fifth, sixth and seventh N-type source-drain regions 31, 32, 33 and 34 spaced apart from each other in the horizontal direction by lower parts of the third to fifth gate electrodes 24 to 26.

Specifically, the three P-type transistors in the second P-type transistor group 22 and the three N-type transistors in the second N-type transistor group 23 respectively share the third gate electrode 24, the fourth gate electrode 25 or the fifth gate electrode in a one-to-one correspondence.

Furthermore, in order to effectively utilize a space in the second device region 4, wide portions 35, 36, 37, 38, 39 and 40 which can form contacts are formed by enlarging suitable portions such as centers and ends of the third to fifth gate electrodes 24 to 26.

The third device region 5 comprises a sixth gate electrode 41 composed of polysilicon extending while being curved in a hook shape in a plurality of portions, a seventh gate electrode 42 composed of polysilicon provided so as to similarly extend while being curved in a hook shape in a plurality of portions and constituting a bottle neck between itself and the sixth gate electrode 41, and an eighth electrode 43 further extending in the vertical direction along one side of the cell region 2 from an end of the seventh gate electrode 42.

Furthermore, the third device region 5 comprises eighth, ninth and tenth P-type source-drain regions 44, 45 and 46 spaced apart from each other in the horizontal direction by one end 41a of the sixth gate electrode 41 and one end 42a of the seventh gate electrode 42, eighth, ninth and tenth N-type source-drain regions 47, 48 and 49 spaced apart from each other in the horizontal direction by the other end 41b of the sixth gate electrode 41 and the other end 42b of the seventh gate electrode 42, eleventh and twelfth P-type source-drain regions 50 and 51 spaced apart from each other by one end 43a of the eighth gate electrode 43, and eleventh and twelfth N-type source-drain regions 52 and 53 spaced apart from each other by the other end 43b of the eighth gate electrode 43.

The one end 41a of the sixth gate electrode 41, the one end 42a of the seventh gate electrode 42, the eighth, ninth and tenth P-type source-drain regions 44, 45 and 46, the one end 43a of the eighth gate electrode 43, and the eleventh and twelfth P-type source-drain regions 50 and 51 constitute a third P-type transistor group 54. Further, the other end 41b of the sixth gate electrode 41, the other end 42b of the seventh gate electrode 42, the eighth, ninth and tenth N-type source-drain regions 47, 48 and 49, the other end 43b of the eighth gate electrode 43, and the eleventh and twelfth N-type source-drain regions 52 and 53 constitute a third N-type transistor group 55.

Furthermore, in order to effectively utilize a space in the third device region 5, wide portions 56, 57 and 58 which can form contacts are formed by enlarging suitable portions such as centers and ends of the sixth to eighth gate electrodes 41 to 43.

The first to twelfth P-type source-drain regions 13 to 15, 28 to 30, 44 to 46, 50, and 51 are composed of P-type impurity diffusion regions, and the first to twelfth N-type source-drain regions 16 to 18, 32 to 34, 47 to 49, 52, and 53 are composed of N-type impurity diffusion regions.

In the first basic cell 1A, the first to eighth gate electrodes 11, 12, 24 to 26, and 41 to 43 have a gate length L1 of the minimum size. In the present embodiment, the gate length L1 is 0.38 $\mu$m.

As shown in FIG. 1(b), the second basic cell 1B has approximately the same pattern as that of the first basic cell 1A shown in FIG. 1(a). In the second basic cell 1B, first to eighth gate electrodes 11, 12, 24 to 26, and 41 to 43 have a gate length L2 larger than the gate length L1 in the first basic cell 1A. In the present embodiment, the gate length L2 is 0.56 $\mu$m.

In the first basic cell 1A shown in FIG. 1(a), the gate length L1 of each of the gate electrodes 11, 12, 24 to 26, and 41 to 43 is set to the minimum size, so that each of the transistors can operate at high speed. Further, it is also possible to reduce the area of the cell region 2.

On the other hand, in the second basic cell 1B shown in FIG. 1(b), the gate length L2 of each of the gate electrodes 11, 12, 24 to 26, and 41 to 43 is set to a size larger than the gate length L1 in the first basic cell 1A. Therefore, each of the transistors operates at lower speed, as compared with that in the first basic cell 1A. However, a leak current drops, resulting in reduced power consumption.

Letting $\Delta L$ be variations in the gate length due to process variations, the ratio of the variations in the gate length to the normal gate length is $\Delta L/L1$ in the first basic cell 1A, while being $\Delta L/L2$ in the second basic cell 1B. Consequently, in the second basic cell 1B, variations in characteristics due to the process variations are made smaller, as compared with those in the first basic cell 1A, so that the yield of the semiconductor integrated circuit device is improved. On the other hand, in the second basic cell 1B, margin to be provided to actual device operations can be decreased in consideration of the process variations, so that the performance of the semiconductor integrated circuit device is prevented from being degraded.

Figure 2:
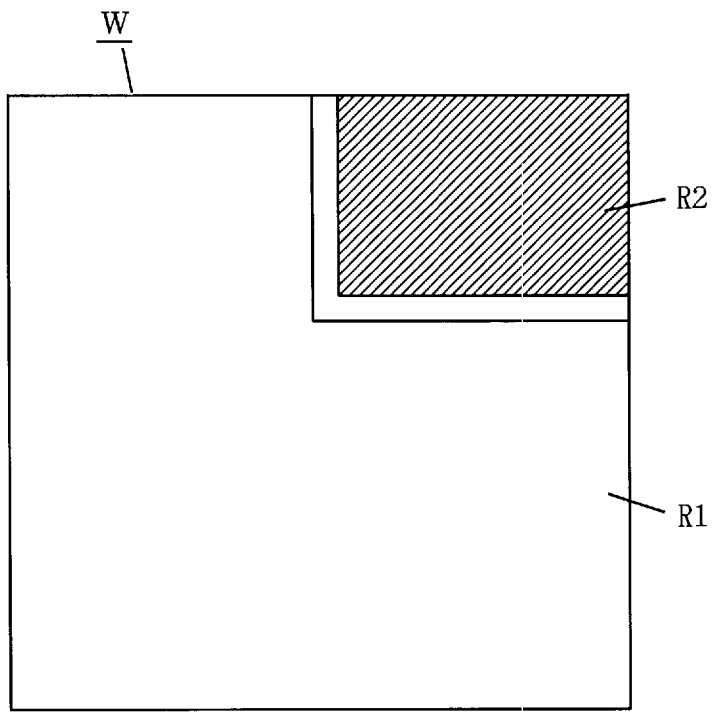
FIG. 2 is a plan view showing an example of a gate array semiconductor integrated circuit device of a master slice system using the first and second basic cells shown in FIG. 1.

FIG. 2 is a plan view showing an example of a gate array semiconductor integrated circuit device of a master slice system using the first basic cell 1A and the second basic cell 1B shown in FIG. 1.

In the example shown in FIG. 2, a plurality of first basic cells 1A are arranged in a first region R1 in an L shape on a semiconductor substrate W, and a plurality of second basic cells 1B are arranged in the remaining region R2 in a rectangular shape.

Figure 3:
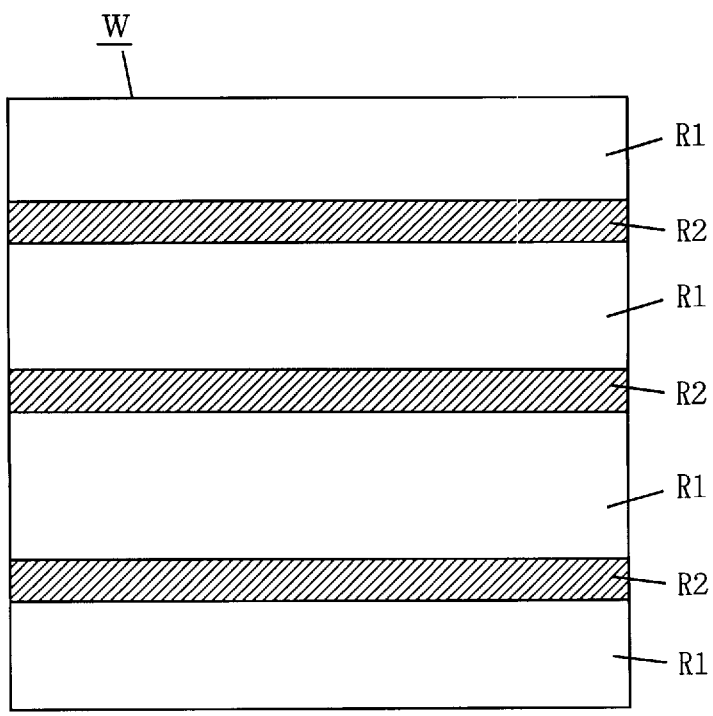
FIG. 3 is a plan view showing another example of a gate array semiconductor integrated circuit device of a master slice system using the first and second basic cells shown in FIG. 1.

FIG. 3 is a plan view showing another example of a gate array semiconductor integrated circuit device of a master slice system using the first basic cell 1A and the second basic cell 1B shown in FIG. 1.

In the example shown in FIG. 3, a plurality of first basic cells 1A are arranged in a plurality of regions R1 in a stripe shape on a semiconductor substrate W, and a plurality of second basic cells 1B are arranged in the remaining regions R2 in a stripe shape.

The arrangement of the first basic cells 1A and the second basic cells 1B is not limited to those in the examples shown in FIGS. 2 and 3. The first and second basic cells can be arranged in an arbitrary pattern.

Figure 4:
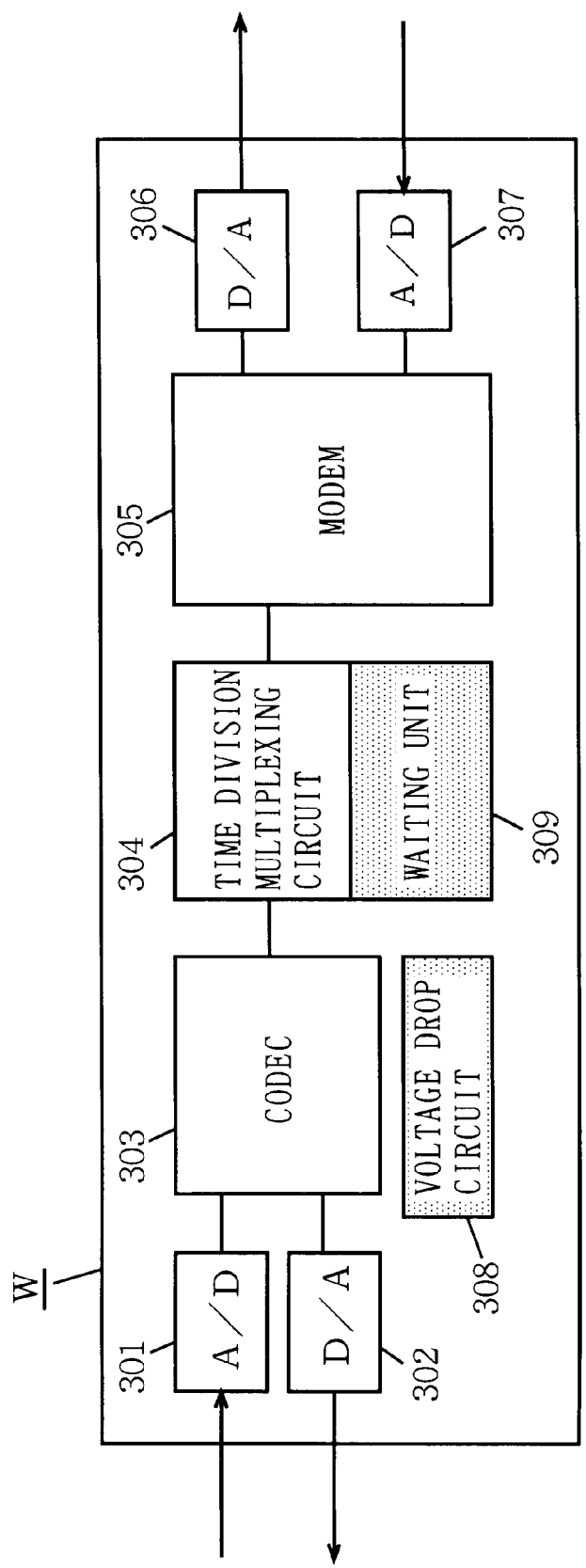
FIG. 4 is a block diagram showing a specific example of a gate array semiconductor integrated circuit device of a master slice system which is constituted by the first and second basic cells shown in FIG. 1.

FIG. 4 is a block diagram showing a specific example of a gate array semiconductor integrated circuit device of a master slice system which is constituted by the first basic cell 1A and the second basic cell 1B shown in FIG. 1. The semiconductor integrated circuit device shown in FIG. 4 is a baseband LSI used for a portable machine for PHS (Personal Handy Phone System).

In FIG. 4, an A/D (analog-to-digital) converter 301, a D/A (digital-to-analog) converter 302, a codec 303, a time division multiplexing circuit 304, a modem 365, a D/A converter 306, an A/D converter 307, a voltage drop circuit 308, and a waiting unit 309.

The codec 303, the time division multiplexing circuit 304, and the modem 305 are constituted by a plurality of first basic cells 1A as shown in FIG. 1(a). The voltage drop circuit 308 and the waiting unit 309 are constituted by the second basic cell 4 shown in FIG. 1(b). The A/D converters 301 and 307 and the D/A converters 302 and 306 are constituted by a macrocell.

The A/D converter 301 converts an inputted analog signal into a digital signal, and feeds the digital signal to the codec 303. The D/A converter 302 converts the digital signal fed from the codec 303 into an analog signal, and outputs the analog signal.

The codec 303 compresses and codes a voice signal, and expands and decodes the voice signal. The time division multiplexing circuit 304 performs time division multiplexing processing of the voice signal. The modem 305 modulates and demodulates the voice signal.

The D/A converter 306 converts the digital signal fed from the modem 305 into an analog signal, and outputs the analog signal. The A/D converter 307 converts the inputted analog signal into a digital signal, and feeds the digital signal to the modem 305. The voltage drop circuit 308 drops an external power supply voltage, and feeds the dropped external power supply voltage to each of the circuits as a power supply voltage. The waiting unit 309 performs waiting processing.

In the codec 303, the time division multiplexing circuit 304, and the modem 305, a high-speed operation is required to process a high-frequency signal. Consequently, the codec 303, the time division multiplexing circuit 304, and the modem 305 are constituted by the first basic cell 1A shown in FIG. 1(a).

On the other hand, power supply voltages of all the transistors formed on the semiconductor substrate W are determined by the voltage drop circuit 308. In the voltage drop circuit 308, when the gate length varies by process variations, the power supply voltages may vary, degrading the characteristics of the LSI. Therefore, a high-precision operation is required of the voltage drop circuit 308. Accordingly, the voltage drop circuit 308 is constituted by the second basic cell 1B shown in FIG. 1(b). Consequently, the effect of the process variations is reduced, so that the yield of the LSI is improved.

The waiting unit 309 is always operated. In the portable machine for PHS, a waiting time period is significantly longer than a conversation time period and a receiving time period. By reducing power in the waiting time period, therefore, it is possible to reduce the entire power consumption of the portable machine for PHS. The waiting unit 309 operates at a low frequency, so that the reduction in the operation speed of the transistors presents no problem, as compared with the codec 303, the time division multiplexing circuit 304, and the modem 305. Therefore, the waiting unit 309 is constituted by the second basic cell 1B shown in FIG. 1(b). Accordingly, a leak current produced at the time of operation is reduced.

As described in the foregoing, in the semiconductor integrated circuit device shown in FIG. 4, the codec 303, the time division multiplexing circuit 304, and the modem 305 which must operate at high speed are constituted by the first basic cell 1A having the gate length L1 of the minimum size, and the voltage drop circuit 308 and the waiting unit 309 which must operate with high precision or operate with low power consumption are constituted by the second basic cell 1B having the large gate length L2. Consequently, it is possible to achieve low power consumption while achieving high speed and high integration density, and prevent the yield and the performance of the semiconductor integrated circuit device from being reduced by process variations.

The first basic cell 1A and the second basic cell 1B in the present embodiment are not applied to only the above-mentioned semiconductor integrated circuit device but applicable to various types of semiconductor integrated circuit devices having as a mixture circuits which must operate at high speed and circuits which must operate with high precision or operate with low power consumption.

Figure 5:
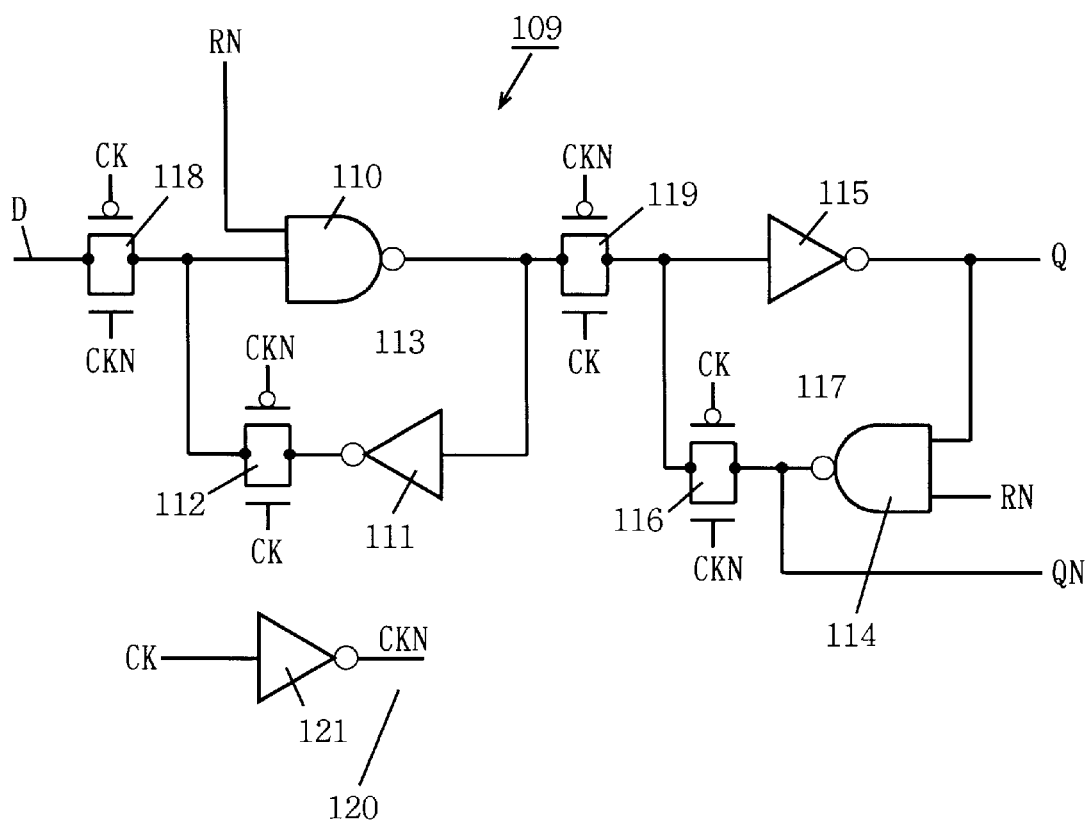
FIG. 5 is a circuit diagram showing a delayed flip flop circuit with reset used as one storage element in a register in a time division multiplexing circuit and a waiting unit shown in FIG. 4.

FIG. 5 is a circuit diagram of a delayed flip flop circuit with reset (hereinafter referred to as a DFF circuit) used as one storage element in a register in the time division multiplexing circuit 304 and the waiting unit 309 shown in FIG. 4.

In the DFF circuit 109 shown in FIG. 5, a latch circuit 113 comprising a NAND circuit 110, an inverter 111, and a transfer gate 112 and a latch circuit 117 comprising a NAND circuit 114, an inverter 115, and a transfer gate 116 are connected in two stages, and a signal Q and its inverted signal QN are outputted from the latch circuit 117 in the rear stage.

An area between an input terminal D and the latch circuit 113 and an area between the latch circuit 113 and the latch circuit 117 are respectively opened or closed by transfer gates 118 and 119. Each of the transfer gates 112, 116, 118 and 119 is opened or closed by clock signals CK and CKN from a clock circuit 120. The clock circuit 120 is constituted by an inverter 121, and outputs a clock signal CK and its inverted signal CKN. A reset signal RN is fed to an input terminal of one of the NAND circuits 110 and 114.

Figure 6:
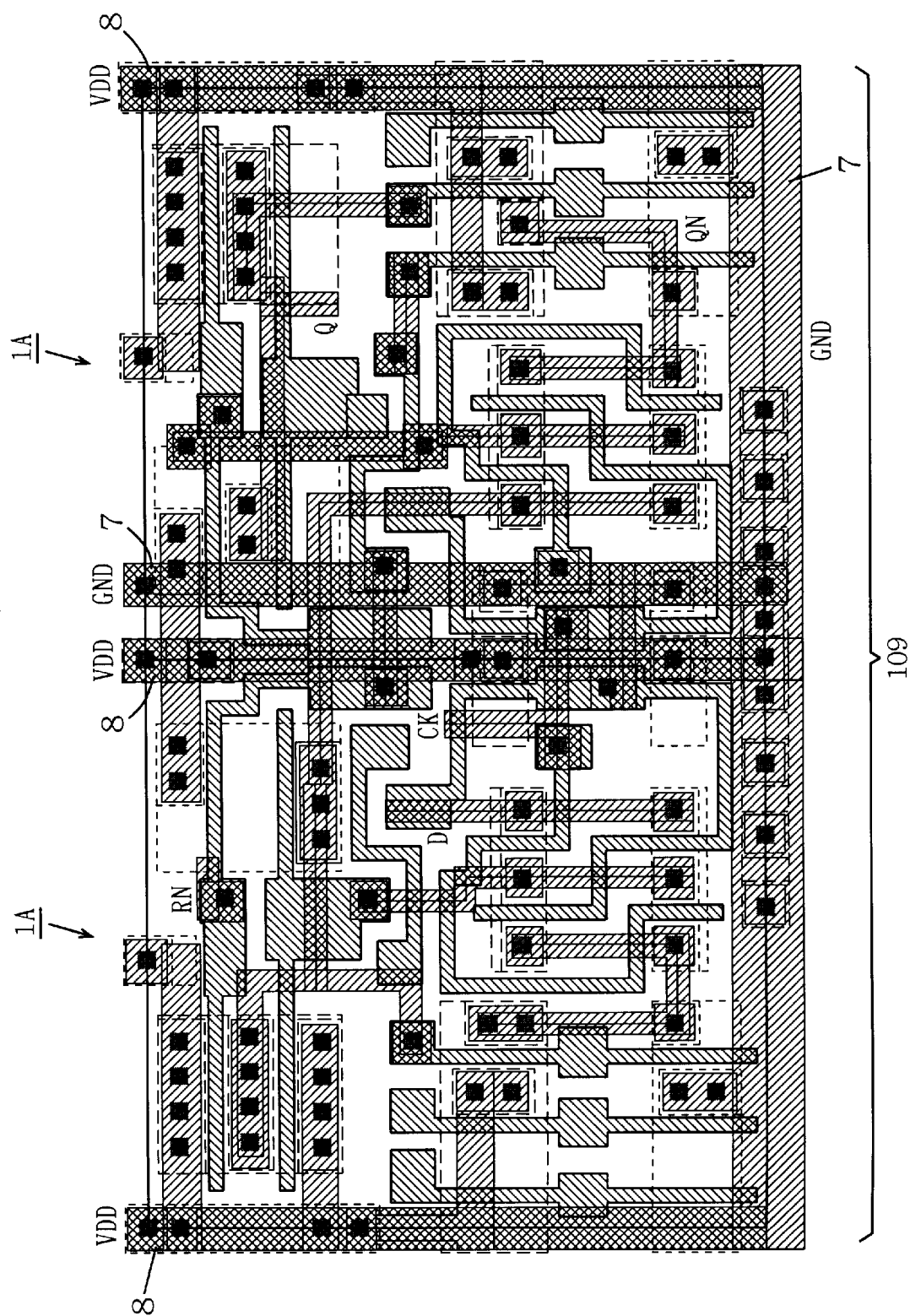
FIG. 6 is an actual wiring diagram in a case where a DFF circuit shown in FIG. 5 is constructed using the first basic cell shown in FIG. 1(a)
Figure 7:
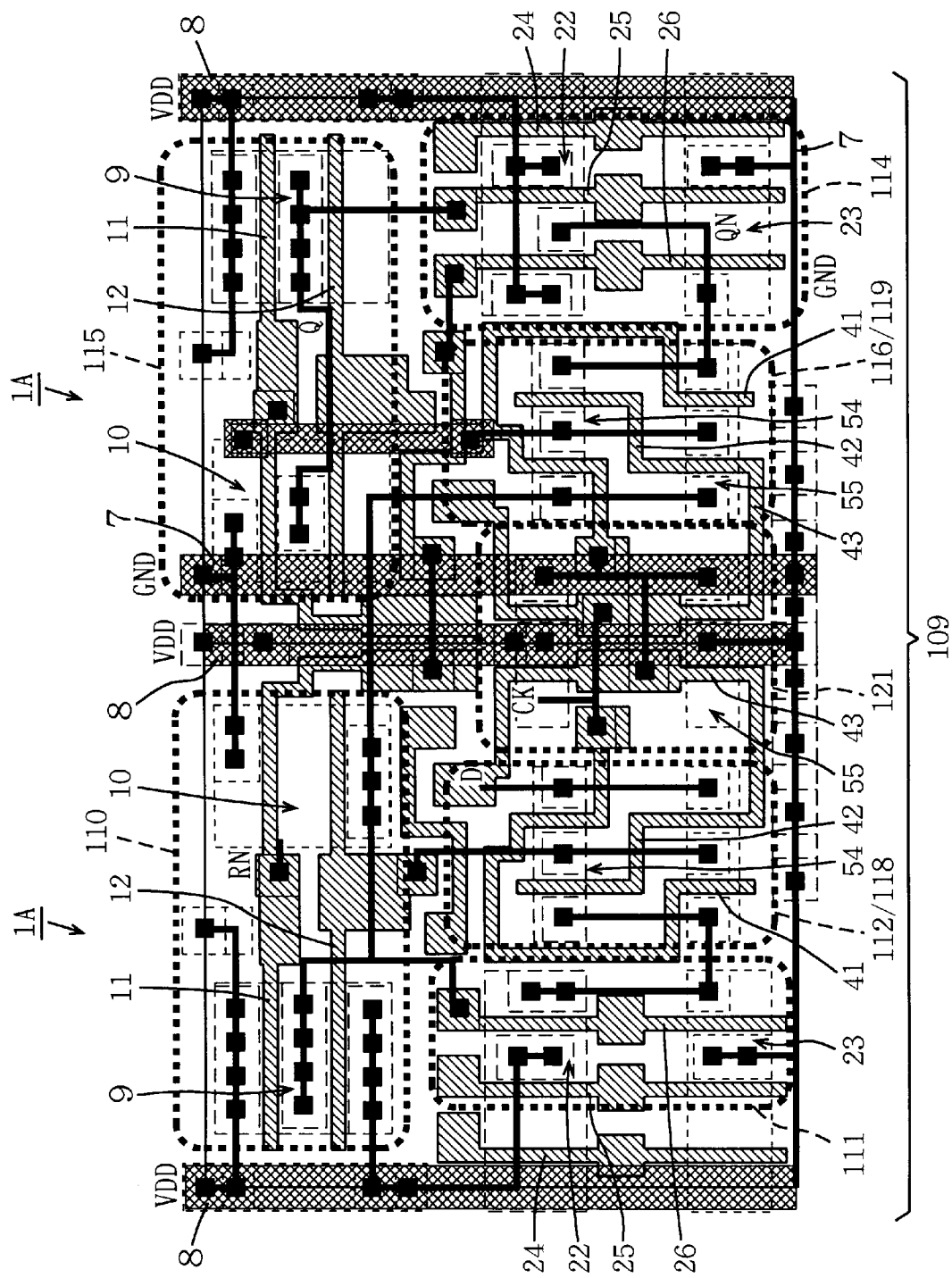
FIG. 7 is an actual wiring diagram in which interconnection layers shown in FIG. 6 are indicated by thick solid lines.

FIG. 6 is an actual wiring diagram in a case where the DFF circuit 109 shown in FIG. 5 is constructed using the first basic cell 1A shown in FIG. 1(a), and FIG. 7 is an actual wiring diagram in which interconnection layers shown in FIG. 6 are indicated by thick solid lines. "■ mark" in FIGS. 6 and 7 indicates a contact. The DFF circuit 109 shown in FIGS. 6 and 7 is used for the time division multiplexing circuit 304 shown in FIG. 4.

As shown in FIGS. 6 and 7, the DFF circuit 109 is constituted by two first basic cells 1A in a mirror arrangement. There is provided a ground interconnection 7 receiving a ground potential GND along continuous one side of the two adjacent first basic cells 1A. Power supply interconnections 8 receiving a power supply voltage VDD along the other two opposite sides of the first basic cell 1A on the left side are respectively provided on the second layer through an insulating film. A ground interconnection 7 receiving a ground potential GND along one side on the left side out of the other two opposite sides of the basic cell 1A on the right side is provided on the second layer through an insulating film, and a power supply interconnection 8 receiving a power supply voltage VDD along the one side on the right side is provided on the second layer through an insulating film. The ground interconnection 7 and the power supply interconnection 8 correspond to power supply lines.

The gate electrode and the source-drain region in each of the transistors, the interconnection pattern 6, the ground interconnection 7, and the power supply interconnection 8 are connected to each other by the interconnection layers indicated by the thick solid lines, thereby constructing the NAND circuits 110 and 114, the inverters 111, 115 and 121, and the transfer gates 112, 116, 118 and 119 shown in FIG. 5.

The interconnection layers are divided into two layers through an insulating film. The interconnection layers connecting the transistors and the ground interconnections 7 are provided on the first layer, and the power supply interconnections 8 are provided on the second layer through an insulating film.

The DFF circuit 109 shown in FIGS. 6 and 7 is constituted by transistors having a gate length L1 of the minimum size, so that it can operate at high speed.

Figure 8:
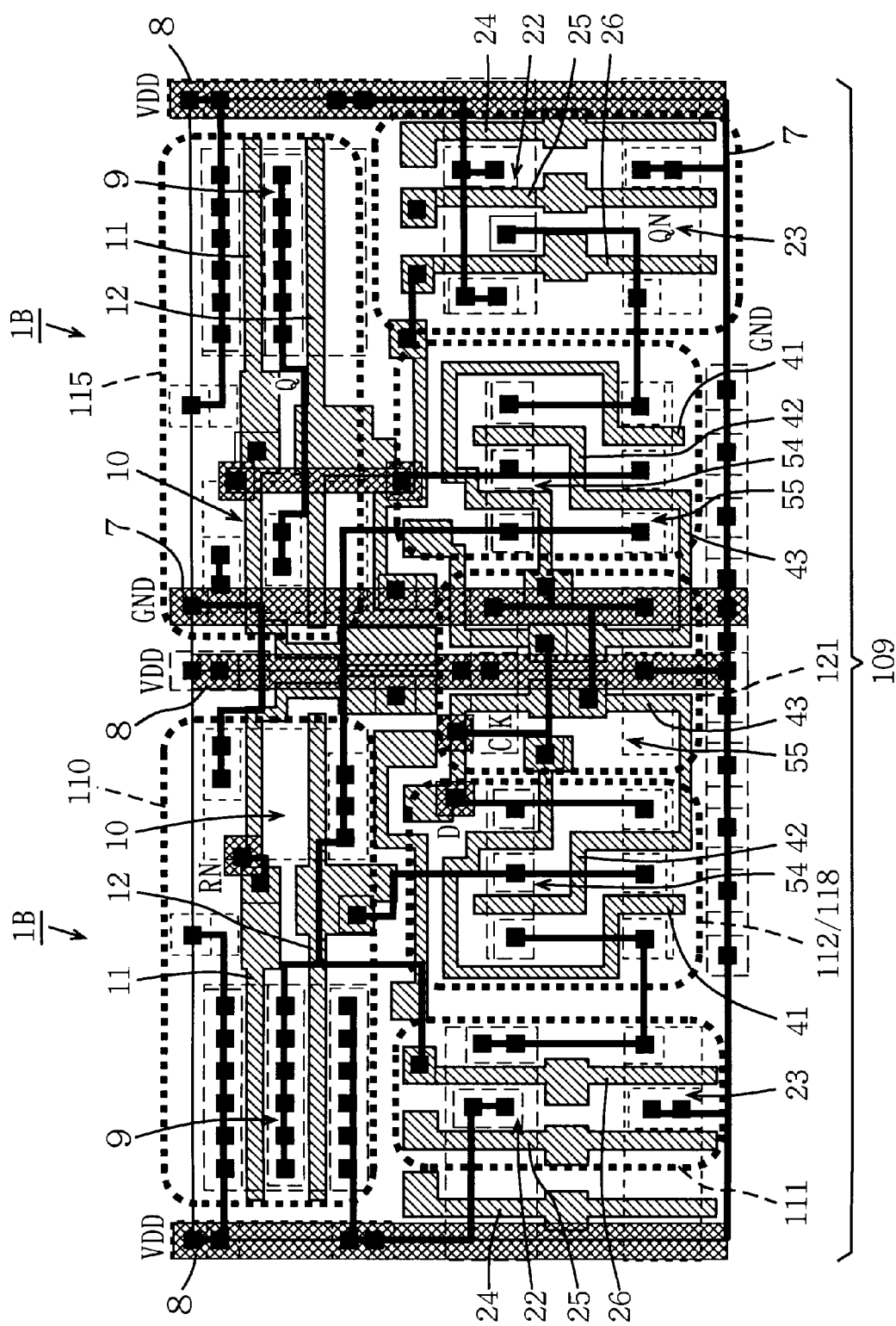
FIG. 8 is an actual wiring diagram in a case where the DFF circuit shown in FIG. 5 is constructed using the second basic cell shown in FIG. 1(b)

FIG. 8 is an actual wiring diagram in a case where the DFF circuit 109 shown in FIG. 5 is constructed using the second basic cell 1B shown in FIG. 1(b). In FIG. 8, interconnection layers are indicated by thick solid lines, as in FIG. 7. "■ mark" in FIG. 8 indicates a contact. The DFF circuit 109 shown in FIG. 8 is used for the waiting unit 309 shown in FIG. 4.

In FIG. 8, the DFF circuit 109 is constituted by two second basic cells 1B in a mirror arrangement. Also in this case, there is provided a ground interconnection 7 receiving a ground potential GND along continuous one side of the two adjacent second basic cells IB. Power supply interconnections 8 receiving a power supply voltage VDD along the other two opposite sides of the second basic cell 1B on the left side are respectively provided on the second layer through an insulating film. A ground interconnection 7 receiving a ground potential GND along one side on the left side out of the other two opposite sides of the basic cell 1A on the right side is provided on the second layer through an insulating film, and a power supply interconnection 8 receiving a power supply voltage VDD along the one side on the right side is provided on the second layer through an insulating film. The ground interconnection 7 and the power supply interconnection 8 correspond to power supply lines.

The gate electrode and the source-drain region in each of the transistors, the interconnection pattern 6, the ground interconnection 7, and the power supply interconnection 8 are connected to each other by the interconnection layers indicated by the thick solid lines, thereby constructing the NAND circuits 110 and 114, the inverters 111, 115 and 121, and the transfer gates 112, 116, 118, and 119.

The interconnection layers are divided into two layers through an insulating film. The interconnection layers connecting the transistors and the ground interconnections 7 are provided on the first layer, and the power supply interconnections 8 are provided on the second layer through the insulating film.

The DFF circuit 109 shown in FIG. 8 is constituted by transistors having a gate length L2 of a large size, so that it can be reduced in power consumption and is hardly affected by process variations.

In the first basic cell 1A and the second basic cell 1B in the present embodiment, the following effects are obtained in addition to the foregoing effects.

(a) The direction in which the transistor groups 9 and 10 in the first device region 3 are arranged and the direction in which the transistor groups 22 and 23 in the second device region 4 are arranged differ from each other by 90 degrees, so that the degree of freedom in the direction of line connection is increased.

(b) In the third device region 5, the sixth and seventh gate electrodes 41 and 42 are curved such that P-type transistors each having as its gate electrode one end 41a of the sixth gate electrode 41 and N-type transistors each having as its gate electrode the other end 42b of the seventh gate electrode 42 are positioned with they being hardly shifted on a straight line in the vertical direction, and N-type transistors each having as its gate electrode the other end 41b of the sixth gate electrode 41 and P-type transistors each having as its gate electrode one end 42a of the seventh gate electrode 42 are positioned with they being hardly shifted on a straight line in the vertical direction. When the transfer gates are constructed at positions on the straight line, therefore, interconnection layers connecting the P-type transistors and the N-type transistors do not cross each other.

Consequently, the length of the interconnection layers connecting the P-type transistors and the N-type transistors becomes shortest, so that the area of the transfer gate itself is reduced, which can contribute to the reduction in the area of the semiconductor integrated circuit device.

(c) The interconnection line 6 is provided, and a wide portion for a contact is provided at the center or the end of each of the gate electrodes, so that the degree of freedom in the positions where lines are connected is increased while effectively making use of a vacant region in the cell region 2.

Particularly, the wide portions 19, 20, 35 to 37, and 57 are respectively provided at the centers of the gate electrodes, so that there is a wider selection of contacts, as compared with that in the conventional example.

(d) In each of the first to third device regions 3 to 5, the P-type transistor and the N-type transistor share the gate electrode. Therefore, the gate electrode shared between the P-type transistor and the N-type transistor need not be connected using a metal interconnection at the time of line connection. Accordingly, the degree of freedom occurs in interconnection regions.

(e) The ground interconnection 7 or the power supply interconnection 8 is provided along two sides, perpendicular to each other, of the cell region 2. In the first basic cell 1A and the second basic cell 1B which differ from each other by 90 degrees in the direction of transistors as in the present embodiment, therefore, it is possible to minimize the length of the interconnection layers connecting the ground interconnection 7 and the power supply interconnection 8 to each of the transistors.

(f) The interconnection layers connecting the transistors and the ground interconnections 7 are positioned on the first layer, and the power supply interconnections 8 are positioned on the second layer. Even when the interconnection layers connecting the transistors (for example, the interconnection layers connecting the basic cells) cross the power supply interconnections 8, therefore, the interconnection layers can be passed under the power supply interconnections 8. Accordingly, the degree of freedom in wiring is increased.

(g) The gate electrodes which are not used as circuits can be used as part of the interconnection layers as they are.

As described in the foregoing, in the DFF circuit 109 which is constructed using the first basic cell 1A or the second basic cell 1B in the present embodiment, the interconnections hardly cross each other, and cross over contact regions of the transistors. Accordingly, the total distance of the interconnections is shortened, and the number of contacts on the contact regions is large.

(2) Second Embodiment

Figure 9:
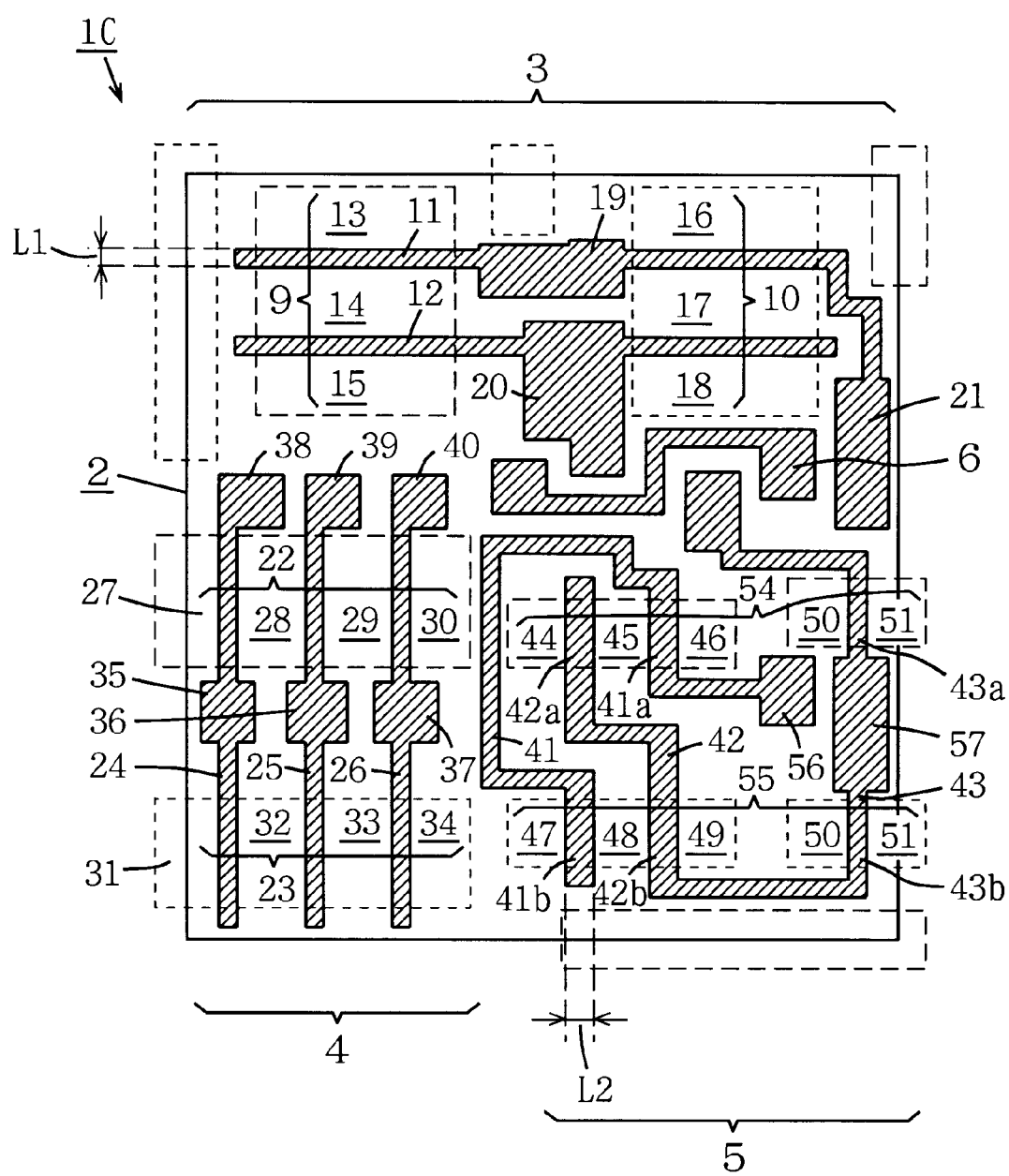
FIG. 9 is a plan view showing the structure of a third basic cell constituting a gate array semiconductor integrated circuit device of a master slice system in a second embodiment of the present invention.

FIG. 9 is a plan view showing the structure of a third basic cell constituting a gate array semiconductor integrated circuit device of a master slice system according to a second embodiment of the present invention.

As shown in FIG. 9, a third basic cell 1C has approximately the same pattern as that of the first basic cell 1A shown in FIG. 1(a). In the third basic cell 1C, however, first to fifth and eighth gate electrodes 11, 12, 24 to 26, and 43 have a gate length L1 of the minimum size, as in the first basic cell 1A, and sixth and seventh gate electrodes 41 and 42 have a gate length L2 larger than the gate length L1, as in the second basic cell 1B. In the present embodiment, the gate length L1 is 0.38 μm, and the gate length L2 is 0.56 μm.

Figure 10:
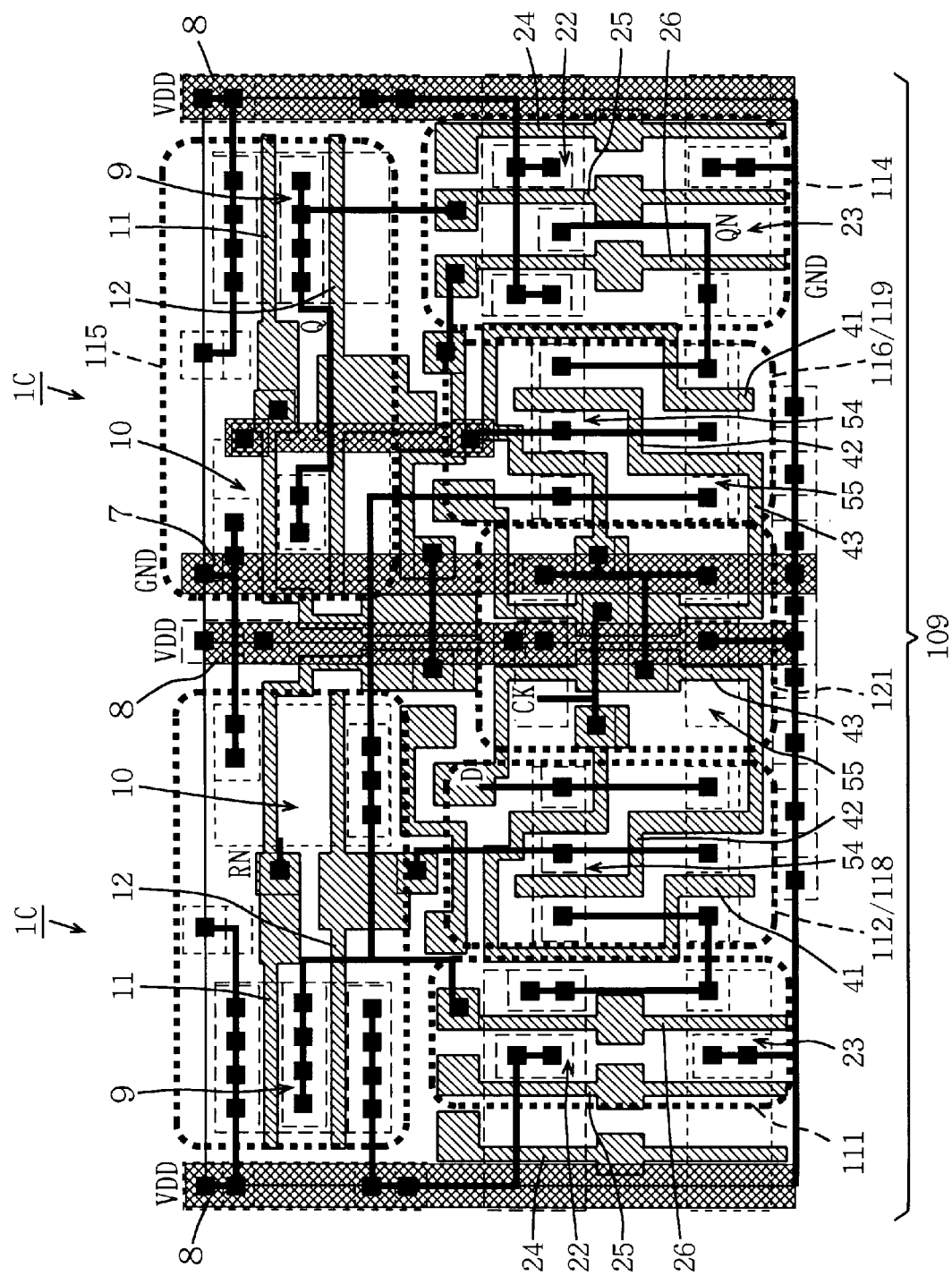
FIG. 10 is an actual wiring diagram in a case where the DFF circuit shown in FIG. 5 is constructed using the third basic cell shown in FIG. 9.
Figure 11:
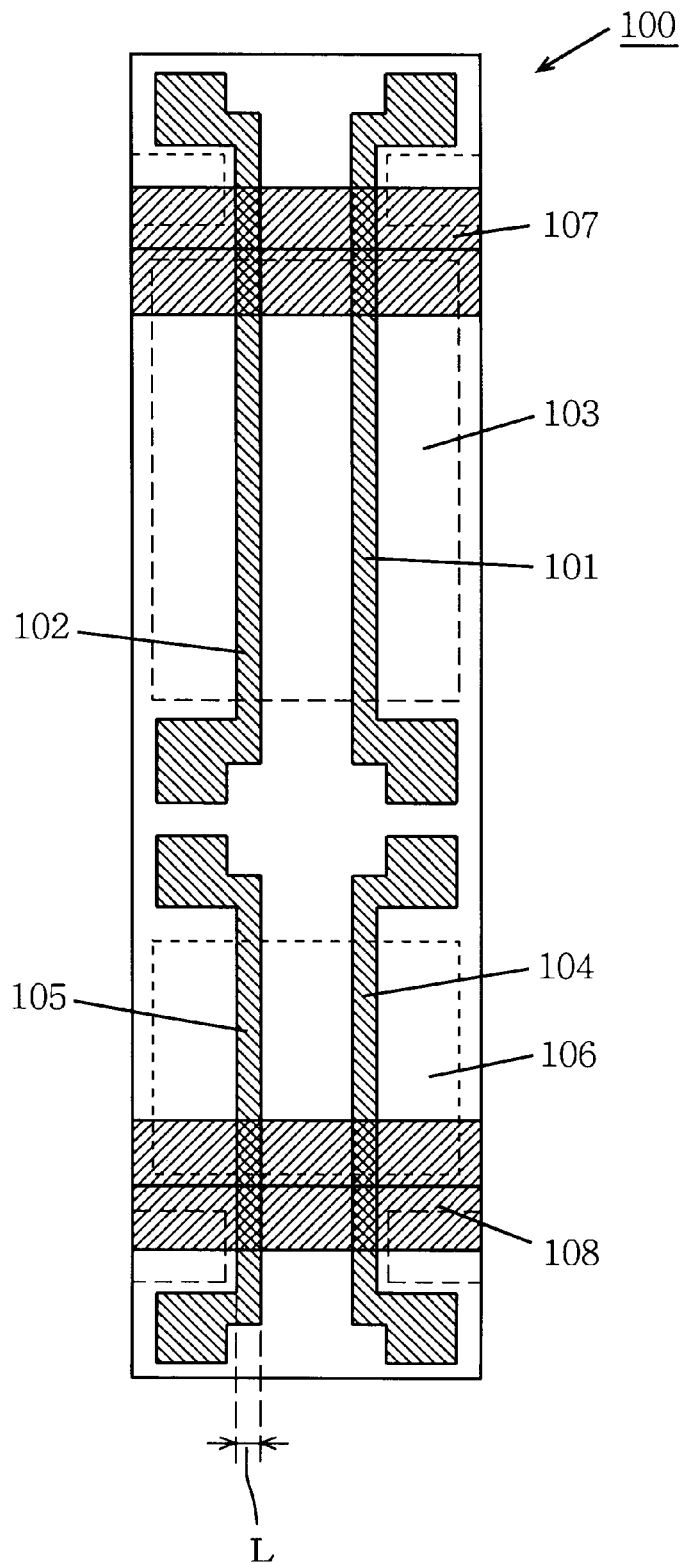
FIG. 11 is a plan view showing the structure of a general basic cell used in a conventional semiconductor integrated circuit device of a master slice system.

FIG. 10 is an actual wiring diagram in a case where the DFF circuit 109 shown in FIG. 5 is constructed using the third basic cell 1C shown in FIG. 9. Also in FIG. 10, interconnection layers are indicated by thick solid lines. "■ mark" in FIG. 10 indicates a contact.

In FIG. 10, the DFF circuit 109 is constituted by two third basic cells 1C in a mirror arrangement. There is provided a ground interconnection 7 receiving a ground potential GND along continuous one side of the adjacent third basic cells 1C. Power supply interconnections 8 receiving a power supply voltage VDD along the other two opposite sides of the third basic cell 1C on the left side are respectively provided on the second layer through an insulating film. A ground interconnection 7 receiving the ground potential GND along one side on the left side out of the other two opposite sides of the basic cell 1A on the right side is provided on the second layer through an insulating film, and a power supply interconnection 8 receiving the power supply voltage VDD along the one side on the right side is provided on the second layer through an insulating film. The ground interconnection 7 and the power supply interconnection 8 correspond to power supply lines.

The gate electrode and the source-drain region in each of the transistors, the interconnection pattern 6, the ground interconnection 7, and the power supply interconnection 8 are connected to each other by the interconnection layers indicated by the thick solid lines, thereby constructing the NAND circuits 110 and 114, the inverters 111, 115 and 121, and the transfer gates 112, 116, 118 and 119 shown in FIG. 5.

In the present embodiment, the NAND circuits 110 and 114 and the inverters 111, 115 and 121 are constituted by transistors having a gate length L1 of the minimum size, and the transfer gates 112, 116, 118 and 119 are constituted by transistors having a gate length L2 of a large size. Consequently, the operation speed of the transistors constituting the transfer gates 112, 116, 118 and 119 is lower than the operation speed of the transistors constituting the NAND circuits 110 and 114 and the inverters 111, 115 and 121. Consequently, the propagation delay of a signal in each of the transfer gates 112, 116, 118 and 119 is increased, so that a through phenomenon of data does not easily occur. Therefore, the DFF circuit 109 is prevented from being erroneously operated by clock skew. That is, clock skew resistance in the DFF circuit 109 is improved.

The clock skew means the shift in phase existing between clock signals in a case where a plurality of storage elements are separately driven by a plurality of clock signals branched from a single clock source. The third basic cell 1C according to the present embodiment is not applied to only the above-mentioned DFF circuit 109 but applicable to various types of semiconductor integrated circuit devices having as a mixture circuits which must operate at high speed and circuits which must operate with high precision or operate with low power consumption.

(3) Another Modified Example

Although the transistors on the basic cell may have different gate widths respectively as shown in FIG. 1, the transistors on the basic cell may have two kinds of size of gate width, or all transistors on the basic cell may have the same size of gate width.

A semiconductor integrated circuit device of a master slice system may be constructed using the first basic cell 1A and the second basic cell 1B in the first embodiment, and the third basic cell 1C in the second embodiment.

Although in the above-mentioned embodiment, description was made of a case where the present invention is applied to the semiconductor integrated circuit device of the master slice system, the present invention is also applicable to a standard cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a substrate; and
   a plurality of basic-cells formed on said substrate, wherein each of said plurality of basic cells comprises one or more transistors pairs,
   each of said one or more transistors pairs include a transistor of a first conductivity type and a transistor of a second conductivity type, said one or more transistor pairs are arranged such that they can be selectively combined with each other,
   said transistor of a first conductivity type and said transistor of a second conductivity type in each of said transistor pairs share a gate electrode, the gate electrode of each of said one or more transistor pairs in at least one of said plurality of basic cells has a gate length different from that of the gate electrode of each of said one or more transistor pairs in another basic cell, at least one of a plurality of transistors is arranged in a direction different from the direction in which another transistor is arranged in each of the basic cells, wherein at least one of a plurality of transistors has a gate length different from that of another transistor in each of the basic cells.

2. The semiconductor integrated circuit device according to claim 1, wherein each of said plurality of basic cells include a plurality of said transistor pairs arranged such that they can be selectively combined with each other.

3. The semiconductor integrated circuit device according to claim 1, wherein at least one of a plurality of transistors has a gate length different from that of another transistor in each of the basic cells.

4. The semiconductor integrated circuit device according to claim 1, wherein one or more transistors in each of the basic cells comprise a gate electrode having a wide portion at its center or end.

5. The semiconductor integrated circuit device according to claim 1, wherein each of the basic cells further comprises an interconnection line provided in a space.

6. The semiconductor integrated circuit device according to claim 1, wherein each of the basic cells is formed in a cell region in a square shape, and further comprises a power supply line provided along at least one side of said cell region.

7. The semiconductor integrated circuit device comprising:

a substrate; and one or a plurality of first basic cells formed on said substrate; and one or a plurality of second basic cells formed on said substrate, said first basic cell comprising a plurality of transistors arranged such that they can be selectively combined with each other and having a first gate length, said second basic cell comprising a plurality of transistors arranged such that they can be selectively combined with each other and having a second gate length larger than said first gate length, one or more transistors in at least one of said one or a plurality of first basic cells being connected to each other, to construct a first circuit which is operable at high speed, one or more transistors in at least one of said one or a plurality of second basic cells being connected to each other, to construct a second circuit which is operable with low power consumption and operable with high precision, at least one of said plurality of transistors being arranged in a direction different from the direction in which another transistor is arranged in each of the first and second basic cells, wherein at least one of a plurality of transistors has a gate length different from that of another transistor in each of the basic cells.

8. The semiconductor integrated circuit device according to claim 7, wherein at least one of a plurality of transistors has a gate length different from that of another transistor in each of the basic cells.

9. The semiconductor device according to claim 7, wherein each of the basic cells further comprises an interconnection line provided in a space among one or more transistors.

10. The semiconductor device according to claim 6, wherein each of the basic cells is formed in a cell region in a square shape, and further comprises a power supply line provided along at least one side of said cell region.

11. The semiconductor device according to claim 6, wherein one or more transistors in each of the basic cells comprises a gate electrode having a wide portion at its center or end.

12. A semiconductor integrated circuit device comprising:

a substrate; and a plurality of basic cells formed on said substrate, each of the basic cells comprising a plurality of transistors arranged such that they can be selectively combined with each other, at least one of said plurality of basic cells including a first device region having a transistor of a first conductivity type and a transistor of a second conductivity type adjacent thereto, and a second device region having a transistor of a first conductivity type and a transistor of a second conductivity type adjacent thereto, each of said transistor in said second device region having a gate length different from that of the transistor of the same conductivity type in said first device region.

13. The semiconductor integrated circuit device according to claim 12, wherein each of said transistors in said first device region is arranged in a direction different from the direction in which each of said transistors is arranged in said second device region.

14. The semiconductor device according to claim 12, wherein each of the basic cells further comprises an interconnection line provided in a space.

15. The semiconductor device according to claim 12, wherein each of the basic cells is formed in a cell region in a square shape, and further comprises a power supply line provided along at least one side of said cell region.

16. The semiconductor device according to claim 12, wherein one or more transistors in each of the basic cells comprise a gate electrode having a wide portion at its center or end.

* * * * *